(12) United States Patent
Lin et al.

(10) Patent No.: US 10,002,761 B2
(45) Date of Patent: Jun. 19, 2018

(54) METHOD FOR FORMING A MULTIPLE LAYER EPITAXIAL LAYER ON A WAFER

(71) Applicant: Taiwan Semiconductor Manufacturing Company, Ltd., Hsin-Chu (TW)

(72) Inventors: Long-Shih Lin, Zhubei (TW); Fu-Hsiung Yang, Zhongli (TW); Kun-Ming Huang, Taipei (TW); Ming-Yi Lin, Hsin-Chu (TW); Po-Tao Chu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 394 days.

(21) Appl. No.: 14/792,111

(22) Filed: Jul. 6, 2015

(65) Prior Publication Data

US 2015/0311070 A1 Oct. 29, 2015

Related U.S. Application Data

(62) Division of application No. 13/770,438, filed on Feb. 19, 2013, now Pat. No. 9,111,898.

(51) Int. Cl.

| | |
|---|---|
| *C30B 25/20* | (2006.01) |
| *H01L 21/02* | (2006.01) |
| *H01L 29/36* | (2006.01) |
| *H01L 29/66* | (2006.01) |
| *H01L 29/739* | (2006.01) |
| *H01L 29/06* | (2006.01) |
| *H01L 21/762* | (2006.01) |

(52) U.S. Cl.
CPC .... *H01L 21/02532* (2013.01); *H01L 21/0257* (2013.01); *H01L 21/02381* (2013.01); *H01L 21/02488* (2013.01); *H01L 21/02587* (2013.01); *H01L 21/76262* (2013.01); *H01L 29/0619* (2013.01); *H01L 29/36* (2013.01); *H01L 29/66325* (2013.01); *H01L 29/7394* (2013.01)

(58) Field of Classification Search
CPC ......... C30B 25/00; C30B 25/02; C30B 25/18; C30B 25/183; C30B 25/186; C30B 25/20; C30B 25/205; C30B 25/22; C30B 29/00; C30B 29/02; C30B 29/06; H01L 21/02532; H01L 21/02381; H01L 21/02488; H01L 21/0257; H01L 21/02587; H01L 21/76262; H01L 29/0619; H01L 29/36; H01L 29/66325; H01L 29/7394
USPC ........ 117/84, 88–92, 94, 103–106, 108, 928, 117/931, 935
See application file for complete search history.

(56) References Cited

U.S. PATENT DOCUMENTS 6,825,110 B2 * 11/2004 Linder .................... H01L 29/36
257/142
7,118,978 B2 10/2006 Okamura
(Continued)

FOREIGN PATENT DOCUMENTS

CN 101764103 A 6/2010

*Primary Examiner* — Kenneth A Bratland, Jr.
(74) *Attorney, Agent, or Firm* — Slater Matsil, LLP

(57) ABSTRACT

A substrate for an integrated circuit includes a device wafer having a raw carrier concentration and an epitaxial layer disposed over the device wafer. The epitaxial layer has a first carrier concentration. The first carrier concentration is higher than the raw carrier concentration.

20 Claims, 4 Drawing Sheets

(56) References Cited

U.S. PATENT DOCUMENTS

| | | | |
|---|---|---|---|
| 2007/0176238 A1* | 8/2007 | Seacrist | H01L 21/02381 257/350 |
| 2008/0054369 A1* | 3/2008 | Schulze | H01L 29/0834 257/378 |
| 2010/0164048 A1 | 7/2010 | Figuet et al. | |
| 2010/0314686 A1* | 12/2010 | Hirano | H01L 21/76283 257/351 |

* cited by examiner

METHOD FOR FORMING A MULTIPLE LAYER EPITAXIAL LAYER ON A WAFER

This application is a divisional of U.S. patent application Ser. No. 13/770,438, filed on Feb. 19, 2013, and entitled "Multiple Layer Substrate," which application is incorporated herein by reference.

TECHNICAL FIELD

The present disclosure relates generally to an integrated circuit and more particularly to a multiple layer substrate.

BACKGROUND

Some integrated circuit devices that conduct with two carriers, such as Lateral Insulated Gate Bipolar Transistors (LIGBTs), have a relatively long turn-off time. Two carrier devices have the recombination of minority carriers when the devices are turning off. A longer turn-off time will limit the application of these devices and the power consumption will also be affected due to the long turn-off time.

BRIEF DESCRIPTION OF THE DRAWINGS

Reference is now made to the following descriptions taken in conjunction with the accompanying drawings, in which.

DETAILED DESCRIPTION

Figure 1:
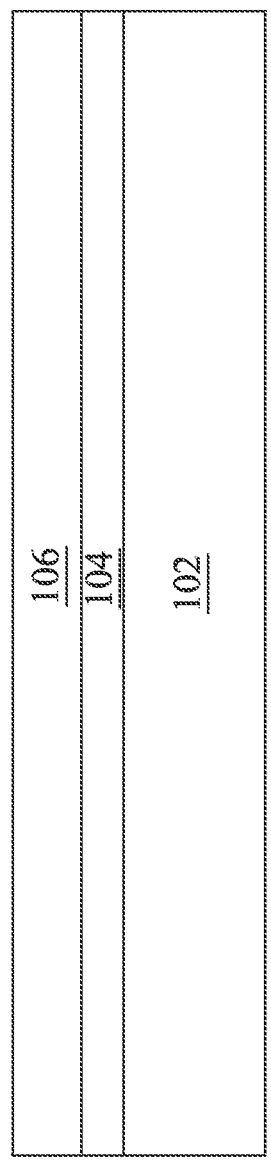
FIGS. 1-2 are intermediate fabrication steps of an exemplary multiple layer substrate for an integrated circuit according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 2:
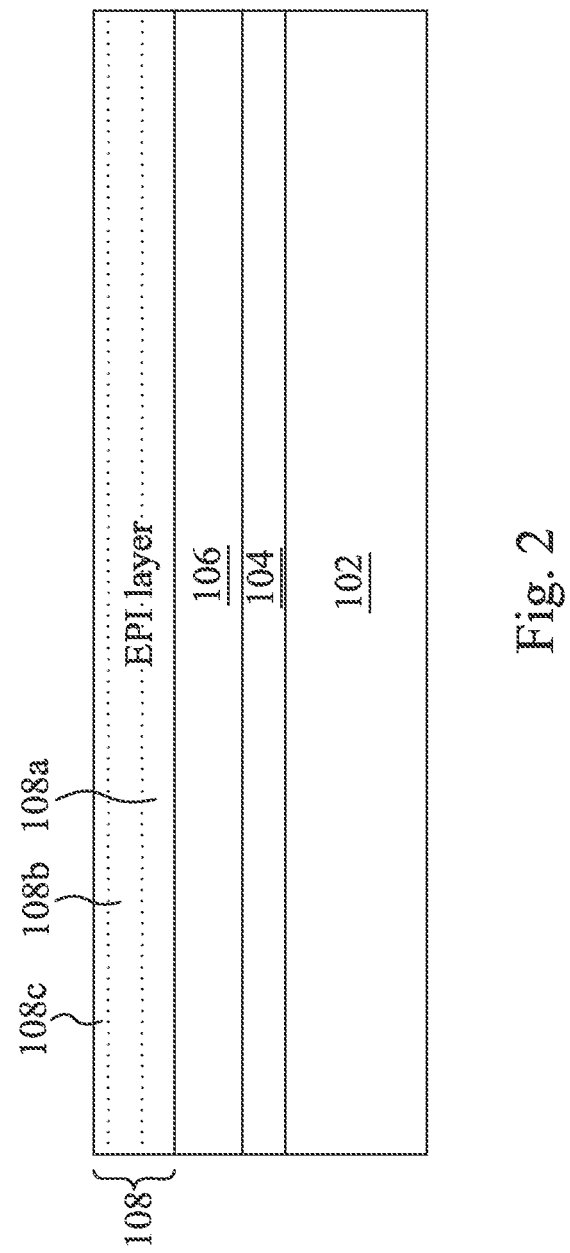

FIGS. 1-2 are intermediate fabrication steps of an exemplary multiple layer substrate for an integrated circuit according to some embodiments. In FIG. 1, a handle wafer 102, a buried oxide (BOX) layer 104 for a silicon-on-insulator (SOI) substrate, and a device wafer 106 are shown. The handle wafer 102 provides support and mechanical strength for the integrated circuit fabrication. The handle wafer 102 comprises silicon or any other suitable material and has a thickness of 600 µm-700 µm in some embodiments. Even though the SOI substrate is shown in FIG. 1, a substrate without the SOI structure may be used in some embodiments.

The BOX layer 104 is an electrically insulating layer and comprises silicon dioxide ($SiO_2$) with a thickness of 1 µm-4 µm in some embodiments. The thickness of the BOX layer 104 depends on a break down voltage of devices to be fabricated over the device wafer 106 in some applications. The device wafer 106 comprises silicon or any other suitable material and has a thickness of 8 µm-25 µm in some embodiments. The device wafer 106 has a raw carrier concentration ranging from 1E14 $cm^{-3}$ to 4E14 $cm^{-3}$ in some embodiments.

In FIG. 2, an epitaxial layer 108 is formed over the device wafer 106 by chemical vapor deposition (CVD), for example. The epitaxial layer 108 can comprise one epitaxial layer or multiple epitaxial layers with different carrier concentrations. For example, three epitaxial layers 108a, 108b, and 108c are shown in FIG. 2. With multiple epitaxial layers such as 108a, 108b, and 108c, device performance (i.e., turn-off time) can be further improved compared to a single epitaxial layer in some embodiments.

The carrier concentration of the epitaxial layer 108 is higher than the raw carrier concentration of the device wafer 106. The carrier concentration of the epitaxial layer 108 ranges from 1.25 to 2.25 times the raw carrier concentration (Craw) in some embodiments. For example, the carrier concentration of the epitaxial layer 108a can be 2.25 times Craw, that of 108b can be 1.75 times Craw, and that of 108c can be 1.25 times Craw.

The higher carrier concentration of the epitaxial layer 108 lowers resistance of the epitaxial layer 108. This improves the recombination efficiency, helps to redistribute electric field, and reduces device turn-off time without device breakdown voltage drop. However, if the carrier concentration of the epitaxial layer 108 is too high, the device breakdown voltage may decrease.

In some embodiments, the second epitaxial layer 108b has a carrier concentration lower than the carrier concentration of the first epitaxial layer 108a. The epitaxial layer 108 comprises silicon and dopants in some embodiments. For an N-type epitaxial layer, the dopants comprise phosphorous, for example. For a P-type epitaxial layer, the dopants comprise boron, for example.

The epitaxial layer 108 can be formed by any methods or processes known in the art. For example, the epitaxial layer 108 can be grown by means of chemical vapor deposition (CVD), i.e. by chemical reaction in the gas-phase product to be epitaxially deposited over the device wafer 106 at temperatures above 1000° C. in some embodiments. In other exemplary embodiments, physical deposition process (i.e., evaporation) is carried out in ultra-high vacuum (below $10^{-8}$ torr) and at substrate temperature not exceeding 800° C.

The total thickness of the device wafer 106 and the epitaxial layer 108 ranges from 8 µm to 25 µm in some embodiments. In some embodiments, the total thickness is maintained similar to a device wafer thickness that does not have the epitaxial layer 108. The three epitaxial layers 108a, 108b, and 108c can have different thickness or the same thickness in various embodiments. In one example, the device wafer has an 8 μm thickness, each of the epitaxial layers 108a, 108b, and 108c has a 2.5 μm thickness for the total thickness of 15.5 μm.

In some embodiments, the carrier concentration of multiple epitaxial layers such as 108a, 108b, and 108c are expressed as the following:

$$C_x = C_1 - \frac{(X-1)}{(N-1)}(C_1 - C_N),\qquad \text{Equation (1)}$$

where the carrier concentration of each epitaxial layer is $C_x$, $C_1$ is the carrier concentration of the first epitaxial layer such as 108a, $C_N$ is the carrier concentration of the top epitaxial layer such as 108c, N is the number of all the epitaxial layers, X is the number of each epitaxial layer increasing by 1 for each epitaxial layer above, and C1 is higher than $C_N$. In some other embodiments, the carrier concentration of multiple epitaxial layers such as 108a, 108b, and 108c can be designed differently depending on the applications.

Figure 3:
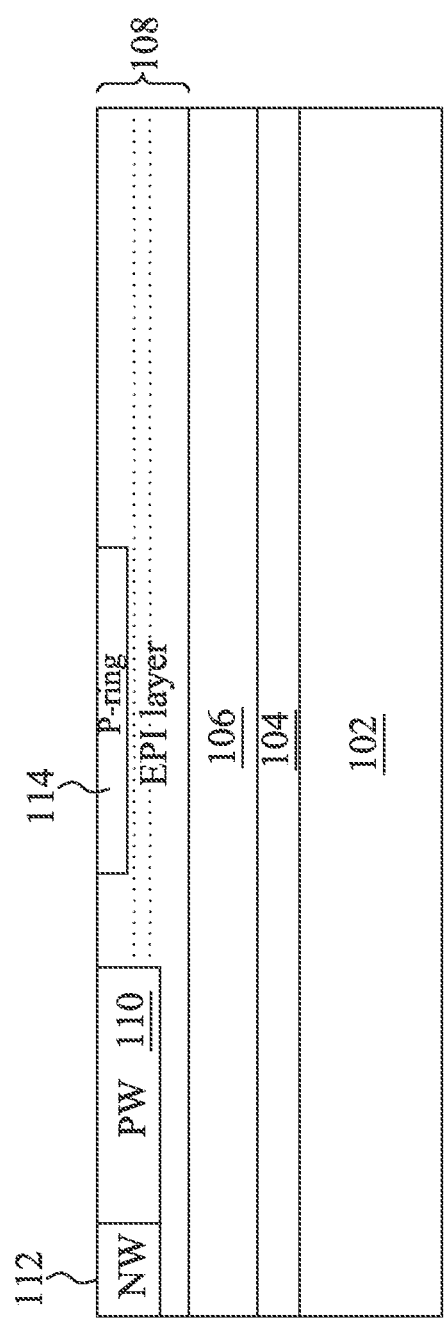
FIGS. 3-4 are exemplary intermediate steps of integrated circuit fabrication over the epitaxial layer 108 and device wafer 106 according to some embodiments.
Figure 4:
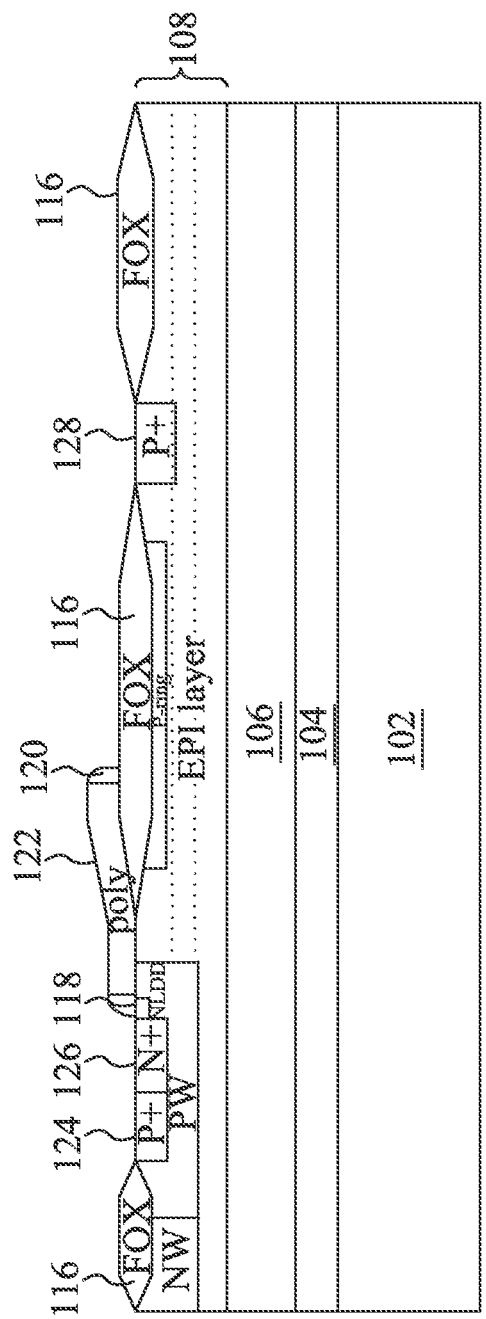

FIGS. 3-4 are exemplary intermediate steps of integrated circuit fabrication over the epitaxial layer 108 and device wafer 106 according to some embodiments. Any methods and processes known in the art can be used to fabricate any desired devices and components over the epitaxial layer 108 and device wafer 106. For example, in FIG. 3, P-wells 110 and 114, and N-well 112 are formed by doping suitable material such as phosphorous for N-type dopants, and boron for P-type dopants.

In FIG. 4, further integrated circuit fabrication steps are performed to form various parts, such as field oxide (FOX) 116, N-type lightly doped drain (NLDD) 118, polysilicon 122, spacer 120, P+ region 124 and 128, and N+ region 126, by any known methods in the art. Even though some exemplary parts are shown in FIG. 4, it is noted that any integrated circuit fabrication process steps can be performed over the substrate comprising the epitaxial layer 108 and the device wafer 106.

According to some embodiments, a substrate for an integrated circuit includes a device wafer having a raw carrier concentration and an epitaxial layer disposed over the device wafer. The epitaxial layer has a first carrier concentration. The first carrier concentration is higher than the raw carrier concentration.

According to some embodiments, a method of fabricating a substrate for an integrated circuit includes providing a device wafer. An epitaxial layer is formed over a device wafer. The device wafer has a raw carrier concentration. The epitaxial layer has a first carrier concentration. The first carrier concentration is higher than the raw carrier concentration.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of fabricating a substrate for an integrated circuit, the method comprising:
   receiving a device wafer; and
   forming a first epitaxial layer over and in physical contact with the device wafer, wherein the device wafer has a raw carrier concentration, the first epitaxial layer has a first carrier concentration adjacent to the device wafer, and the first carrier concentration ranges from 1.25 to 2.25 times the raw carrier concentration.

2. The method of claim 1, further comprising forming a second epitaxial layer over the first epitaxial layer, wherein the second epitaxial layer has a second carrier concentration lower than the first carrier concentration.

3. The method of claim 1, wherein the device wafer comprises silicon.

4. The method of claim 1, further comprising forming additional epitaxial layers over the first epitaxial layer, each of the additional epitaxial layers having a carrier concentration $C_x$, wherein $$C_x = C_1 - \frac{(X-1)}{(N-1)}(C_1 - C_N),$$

$C_1$ is the first carrier concentration, $C_N$ is a carrier concentration of a top epitaxial layer, N is a number of the epitaxial layers including the first epitaxial layer and the additional epitaxial layers, X is a number of each epitaxial layer starting with 2 for the additional epitaxial layer directly above the first epitaxial layer and increasing by 1 for each additional epitaxial layer above, and $C_1$ is higher than $C_N$.

5. The method of claim 1, wherein the first epitaxial layer comprises silicon and dopants.

6. The method of claim 5, wherein the dopants comprise at least one of phosphorous.

7. The method of claim 5, wherein the dopants comprise boron.

8. A method for forming a substrate for an integrated circuit, the method comprising:
   forming a buried oxide layer over a handle wafer;
   forming a device wafer having a raw carrier concentration over the buried oxide layer;
   forming a first epitaxial layer over the device wafer, the first epitaxial layer having a first carrier concentration higher than the raw carrier concentration; and
   forming additional epitaxial layers over the first epitaxial layer, each of the additional epitaxial layers having a carrier concentration $C_x$, wherein $$C_x = C_1 - \frac{(X-1)}{(N-1)}(C_1 - C_N),$$

$C_1$ is the first carrier concentration, $C_N$ is a carrier concentration of a top epitaxial layer, N is a number of the epitaxial layers including the first epitaxial layer and the additional epitaxial layers, X is a number of each epitaxial layer starting with 2 for the additional epitaxial layer directly above the first epitaxial layer and increasing by 1 for each additional epitaxial layer above, and $C_1$ is higher than $C_N$.

9. The method of claim 8, wherein the first carrier concentration ranges from 1.25 to 2.25 times the raw carrier concentration.

10. The method of claim 8, wherein the device wafer comprises silicon.

11. The method of claim 8, wherein the first epitaxial layer comprises silicon and dopants.

12. The method of claim 11, wherein the dopants comprise one of phosphorous and boron.

13. The method of claim 8, wherein the additional epitaxial layers comprise silicon with dopants.

14. The method of claim 8, wherein each of the additional epitaxial layers has a same thickness.

15. A method of forming a semiconductor device, the method comprising:
    forming a semiconductor wafer comprising silicon, the semiconductor wafer having a raw carrier concentration; and
    forming an epitaxial layer directly on the semiconductor wafer, the epitaxial layer comprising silicon and dopants, wherein the forming the epitaxial layer forms the epitaxial layer having a first carrier concentration greater than the raw carrier concentration of the semiconductor wafer, and wherein the first carrier concentration of the epitaxial layer is from about 1.25 times to about 2.25 times the raw carrier concentration.

16. The method of claim 15, further comprising forming a doped well region in the epitaxial layer.

17. The method of claim 15, wherein forming the epitaxial layer comprises forming a plurality of epitaxial layers.

18. The method of claim 15, further comprising:
    forming a handle wafer; and
    forming a buried oxide layer intermediate the semiconductor wafer and the handle wafer.

19. The method of claim 15, further comprising forming additional epitaxial layers over the epitaxial layer, each of the additional epitaxial layers having a carrier concentration $C_x$, wherein $$C_x = C_1 - \frac{(X-1)}{(N-1)}(C_1 - C_N),$$

$C_1$ is the first carrier concentration, $C_N$ is a carrier concentration of a top epitaxial layer, N is a number of the epitaxial layers including the epitaxial layer and the additional epitaxial layers, X is a number of each epitaxial layer starting with 2 for the additional epitaxial layer directly above the epitaxial layer and increasing by 1 for each additional epitaxial layer above, and $C_1$ is higher than $C_N$.

20. The method of claim 15, further comprising:
    forming a second epitaxial layer over the epitaxial layer, the second epitaxial layer having a second carrier concentration; and
    forming a third epitaxial layer over the second epitaxial layer, the third epitaxial layer having a third carrier concentration, wherein the first carrier concentration is 2.25 times the raw carrier concentration, the second carrier concentration is 1.75 times the raw carrier concentration, and the third carrier concentration is 1.25 times the raw carrier concentration.

* * * * *